United States Patent [19]
Nakano

[11] Patent Number: 4,983,931
[45] Date of Patent: Jan. 8, 1991

[54] CR-TYPE OSCILLATOR CIRCUIT
[75] Inventor: Masaji Nakano, Tokyo, Japan
[73] Assignee: NEC Corporation, Tokyo, Japan
[21] Appl. No.: 545,348
[22] Filed: Jun. 27, 1990
[30] Foreign Application Priority Data
Jun. 29, 1989 [JP] Japan ................................ 1-169449
[51] Int. Cl.$^5$ ............................................. H03K 3/00
[52] U.S. Cl. ..................................... 331/111; 331/143
[58] Field of Search ................... 331/108 R, 111, 143, 331/177 R

[56] References Cited
U.S. PATENT DOCUMENTS
4,590,444  5/1986  Wilcox ............................. 331/111
4,904,960  2/1990  Izadinia et al. .................. 331/111

Primary Examiner—Robert J. Pascal
Attorney, Agent, or Firm—Helfgott & Karas

[57] ABSTRACT

A CR-type oscillator circuit of the invention includes a reference resistor; a current mirror circuit for taking out the current flowing in the reference resistor; and a reference capacitor whose charging and discharging is repeated by the current taken out by the current mirror circuit within a predetermined potential changing range which is determined by a resistor divider network formed by a plurality of resistors connected in series. The oscillator circuit further includes a control circuit for maintaining at a constant value the ratio between the potential changing range of the charging and discharging of the reference capacitor and the potential difference developed across the reference resistor. The CR-type oscillator circuit of the invention generates stable oscillation frequency which has no dependency on the power supply voltages or the threshold voltages of the transistors concerned.

6 Claims, 3 Drawing Sheets

CR-TYPE OSCILLATOR CIRCUIT

BACKGROUND OF THE INVENTION

The present invention relates to a CR-type oscillator circuit and, more particularly, to a CR-type oscillator circuit having a high stability with respect to oscillation frequency.

As a conventional typical CR-type oscillator circuit, there has been known a circuit which includes a reference resistor, a current mirror circuit and a reference capacitor and in which the current flowing in the reference resistor is taken out by the current mirror circuit for repeating the charging and discharging of the reference capacitor. However, in such a circuit, the ratio between the potential changing range in the repeated charging and discharging of the reference capacitor and the potential differences appearing across the reference resistor was not maintained constant because of, for example, the changes in power supply voltages, so that it was difficult to avoid variations in oscillation frequency.

SUMMARY OF THE INVENTION

It is, therefore, an object of the invention to overcome the problems existing in the conventional CR-type oscillator circuit and to provide an improved CR-type oscillator circuit having a high stability in oscillation frequency.

It is another object of the invention to provide a CR-type oscillator circuit whose oscillation frequency is not affected by the variations in power supply voltages or the threshold voltages of the transistors concerned.

It is still another object of the invention to provide a CR-type oscillator circuit having a control circuit which can maintain at a constant value the ratio between the potential variations in the repeated charging and discharging of the reference capacitor and the potential differences developed across the reference resistor.

In carrying out the above and other objects of the invention in one form, there is provided an improved CR-type oscillator circuit for producing triangular waves, the circuit comprising:
a reference resistor;
a current mirror circuit for taking out the current flowing in the reference resistor;
a reference capacitor whose charging and discharging is repeated within a predetermined potential changing range by the current taken out by the current mirror circuit;
a resistor divider network having a plurality of resistors connected in series for determining the potential changing range of the charging and discharging of the reference capacitor; and
a control circuit for maintaining at a constant value the ratio between the potential changing range of the charging and discharging of the reference capacitor and the potential differences developed across the reference resistor.

BRIEF DESCRIPTION OF THE DRAWINGS

The above and other objects, features and advantages of the present invention will be apparent from the following description of preferred embodiments according to the invention explained with reference to the accompanying drawings, in which.

PREFERRED EMBODIMENTS OF THE INVENTION

Throughout the following explanation, similar reference symbols or numerals refer to the same or similar elements in all the figures of the drawings.

Firstly, for the purpose of assisting in the understanding of the present invention, a conventional CR-type oscillator circuit and problems existing therein will be explained by making reference to FIGS. 1 and 2 before the present invention is explained.

Figure 1:
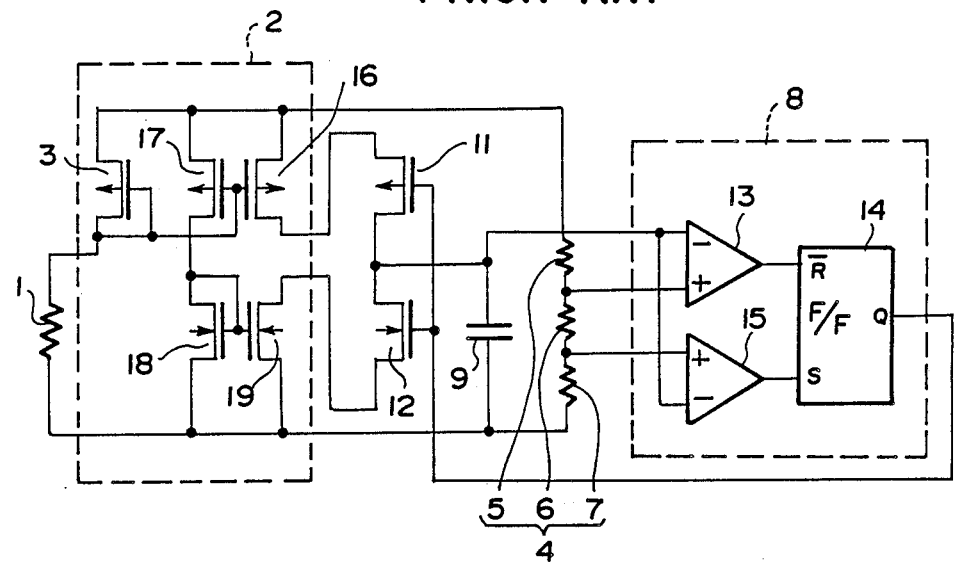
FIG. 1 is a circuit diagram of a conventional CR-type oscillator circuit.

As shown in FIG. 1, the conventional CR-type oscillator circuit comprises a reference resistor 1, a reference capacitor 9 and a current mirror circuit 2 which takes out the current flowing in the reference resistor 1 and repeats the charging and discharging of the reference capacitor 9. The circuit also includes a Schmitt circuit 8, a pair of P-and N-channel MOS transistors 11, 12, and a resistor divider network 4 having resistors 5, 6, 7 connected in series.

The current mirror circuit 2 includes P-channel MOS transistors 3, 16, 17 and N-channel MOS transistors 18, 19. The gates of the P-channel transistors 16, 17 and the gate and drain of the P-channel transistor 3 are connected together and so are the gates of the N-channel transistors 18, 19. The reference resistor 1 is connected between the gates of the P-channel transistors 3, 16, 17 and the sources of the N-channel transistors 18, 19. The Schmitt circuit 8 includes two differential amplifiers 13, 15, inverting inputs thereof being connected with each other, and an RS-type flip-flop circuit 14.

In the conventional CR-type oscillator circuit as described above, the oscillation frequencies are difficult to keep stable because the ratio between the potential changing range of the charging and discharging of the reference capacitor 9 and the potential differences appearing across the reference resistor 1 unavoidably changes according to the changes in the power supply voltages or due to the variations in the threshold voltages of the transistors concerned.

Figure 2:
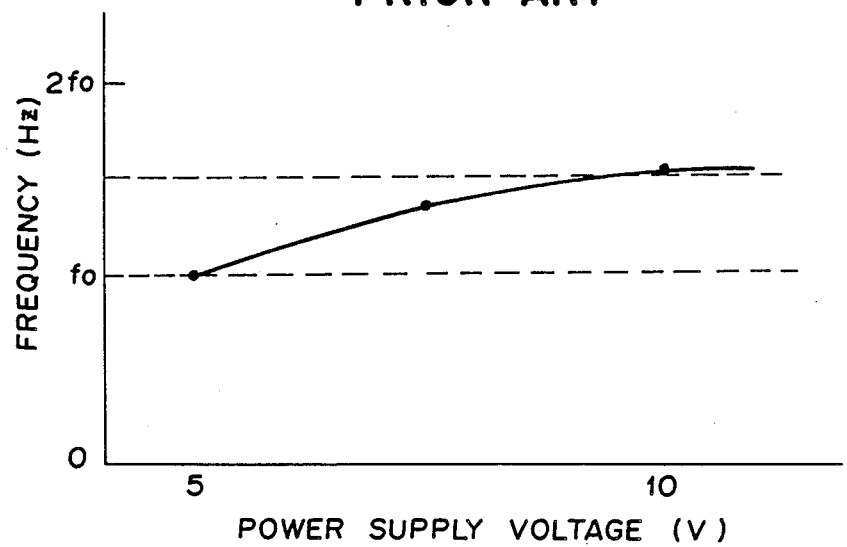
FIG. 2 is a graph showing changes in oscillation frequencies in the conventional circuit shown in FIG. 1.

In the conventional oscillator circuit of FIG. 1 operating at 5 volts as the power supply voltage, assuming that the threshold voltage of the P-channel MOS transistor 3 is 2.5 volts, the changes in the oscillation frequencies will be as shown in FIG. 2 graph and these are due to the changes of the above-mentioned ratio in accordance with the variations in the power supply voltage. Here, if the power supply voltages change from 5 volts to 10 volts, it means that the resultant oscillation frequency (f) has shown a rise of approximately 50% from the basic oscillation frequency ($f_0$).

Figure 3:
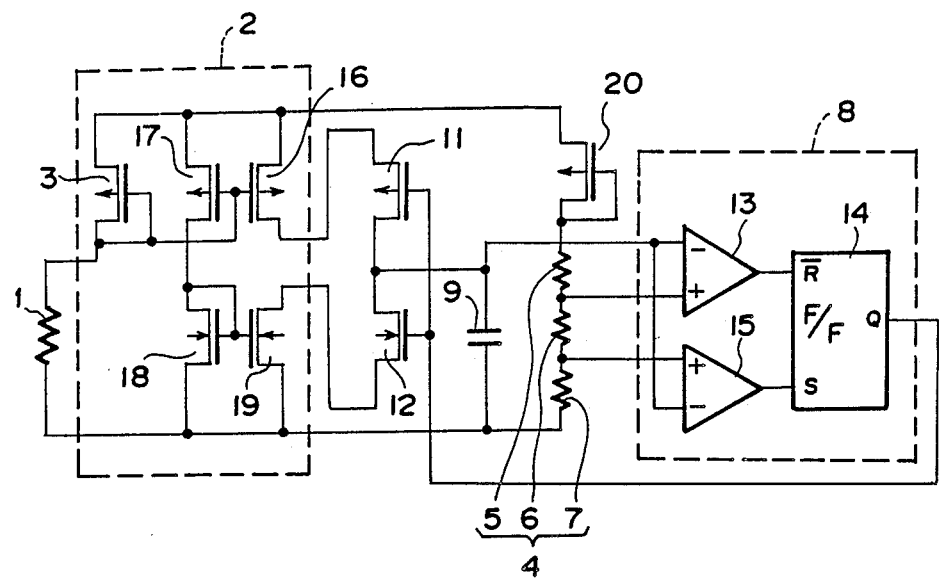
FIG. 3 is a circuit diagram of a CR-type oscillator circuit as a first embodiment according to the present invention.
Figure 4:
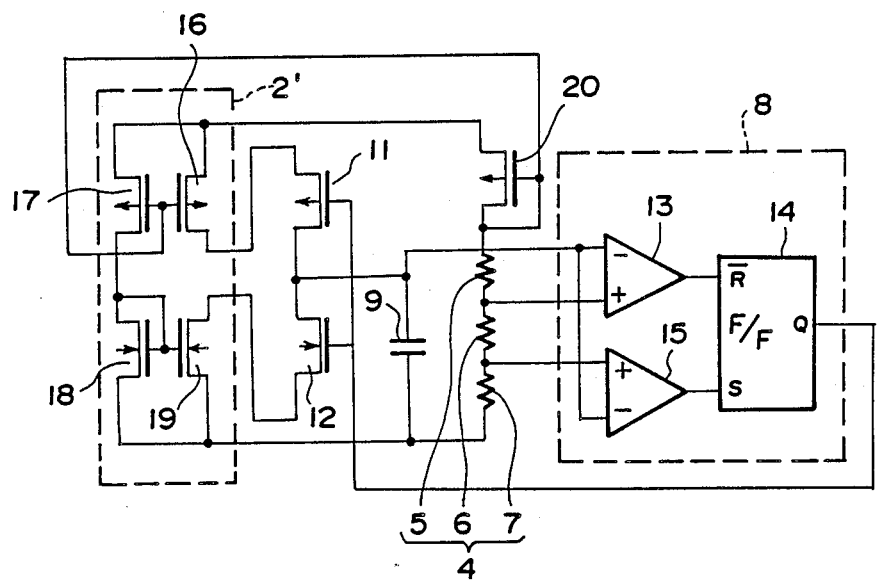
FIG. 4 is a circuit diagram of a CR-type oscillator circuit as a second embodiment according to the present invention.
Figure 5:
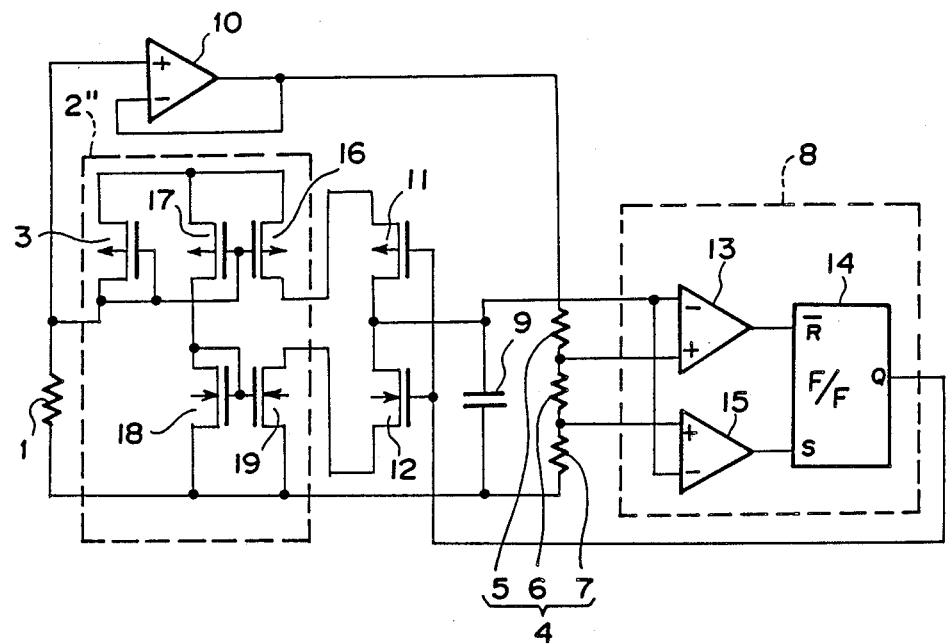
FIG. 5 is a circuit diagram of a CR-type oscillator circuit as a third embodiment according to the present invention.

Next, the present invention is explained hereunder in detail with reference to FIGS. 3, 4 and 5 which respectively illustrate preferred embodiments of the invention.

FIG. 3 shows a circuit diagram of an improved CR-type oscillator circuit as a first embodiment according to the present invention.

In FIG. 3, the CR oscillator circuit comprises a current mirror circuit 2 with a reference resistor 1 connected thereto; a Schmitt circuit 8 having two differential amplifiers 13, 15 as well as an $\overline{RS}$-type flip-flop circuit 14; a pair of P- and N-channel transistors 11, 12; a resistor divider network 4 having resistors 5, 6, 7 connected in series; and a reference capacitor 9. The current mirror circuit 2 includes a P-channel transistor 3, P-channel transistors 16, 17 having their gates connected together and, N-channel transistors 18, 19 having likewise their gates connected together. This CR oscillation circuit further comprises a P-channel transistor 20 disposed between the current mirror circuit 2 and the resistor divider network 4. This P-channel transistor 20 is an element which did not exist in the prior art CR-type oscillator circuit as shown in FIG. 1. More specifically, the P-channel transistor 20 has its source connected to respective sources of the P-channel transistors 3, 16, 17 in the current mirror circuit 2 and has its gate and drain connected together and further connected to the resistor 5 of the resistor divider network 4.

One end of the reference resistor 1 is connected to the gate and drain of the P-channel transistor 3 constituting a part of the current mirror circuit 2, while one end of the resistor divider network 4 having three resistors 5, 6, 7 connected in series is connected to the gate and drain of the P-channel transistor 20. The respective potentials appearing at the one junction between the resistors 5 and 6, and at the other junction between the resistors 6 and 7 are inputted as comparison potentials to the comparators 13, 15 constituting a part of the Schmitt circuit 8, whereby, within the range of the above respective comparison potentials, the charging and discharging of the reference capacitor 9 is repeated based on the current flowing in the reference resistor 1, taken out by the current mirror circuit 2.

Therefore, where the ratio between the resistance of the P-channel transistor 3 in its on-state and the resistance of the reference resistor 1 and the ration between the resistance of the P-channel transistor 20 in its on-state and the total resistance value of the three resistors 5, 6, 7 of the resistor divider network 4 for producing the comparison potentials are of the same value, the drain potential of the P-channel transistor 3 and that of the P-channel transistor 20 become identical with each other. Where such potential is $V_R$ and the ratio between such potential $V_R$ and the potential range of the charging and discharging of the reference capacitor 9, which range being determined by the resistance ratio of the serially connected three resistors 5, 6, 7 producing the comparison potentials, is $\alpha$, the following equation is given:

$$f = \frac{\frac{V_R}{R}}{C \cdot \alpha V_R} = \frac{1}{\alpha \cdot CR}$$

where C represents the capacitance of the reference capacitor 9 and R represents the resistance of the reference resistor 1. It can readily be understood from the above equation that the oscillation frequency has no dependency on or is not affected by, for example, the power supply voltages.

Next, FIG. 4 shows an improved CR-type oscillator circuit as a second embodiment according to the present invention.

In the CR oscillator circuit of the second embodiment shown in FIG. 2, the current mirror circuit 2' includes two P-channel transistors 16, 17 and two N-channel transistors 18, 19 but does not include the P-channel transistor 3 shown in FIG. 3. The remaining portions of the circuit are the same as those in FIG. 3 except for an arrangement wherein the reference resistor 1 does not exist in this embodiment. In this second embodiment, the resistor divider network 4 itself, formed by the three resistors 5, 6, 7 connected in series, serves also as the reference resistor 1 in FIG. 3. The potentials at the respective junctions of the three resistors 5, 6, 7 are inputted to the differential comparators 13, 15 as comparison potentials in the same manner as in FIG. 3 circuit. The CR oscillator circuit of this embodiment has an advantage that the circuit construction can be made simpler as compared to the FIG. 3 circuit.

FIG. 5 shows an improved CR-type oscillator circuit as a third embodiment according to the present invention.

This embodiment shown in FIG. 5 is different from that shown in FIG. 3 in that there is no transistor corresponding to the P-channel transistor 20 in FIG. 3, but a buffer circuit 10 is interposed between the reference resistor 1 and the resistor 5 of the resistor divider network 4. The remaining portion of the current mirror circuit 2'' is the same as that shown in FIG. 3.

According to this third embodiment, since the potential drop across the reference resistor 1 is supplied through the buffer circuit 10 to the resistor divider network 4 producing the necessary comparison potentials to the Schmitt circuit 8, it is possible to provide an oscillator circuit having a high stability against any changes in the power supply voltages even when the resistance value of the reference resistor 1 is selected as necessary.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A CR-type oscillator circuit for generating triangular waves, said circuit comprising:
   a reference resistor;
   a current mirror circuit for taking out the current flowing in said reference resistor;
   a reference capacitor whose charging and discharging is repeated within a predetermined potential changing range by the current taken out by said current mirror circuit;
   a resistor divider network having a plurality of resistors connected in series for determining said potential changing range of the charging and discharging of said reference capacitor; and
   a control circuit for maintaining at a constant value the ratio between said potential changing range of the charging and discharging of said reference capacitor and the potential differences developed across said reference resistor.

2. A CR-type oscillator circuit according to claim 1, in which said control circuit includes:
- a first P-channel transistor forming a part of said current mirror circuit and having its gate and drain connected to one end of said reference resistor; and
- a second P-channel transistor having its gate and drain connected to one end of said resistor divider network;
- whereby, when the ratio between the resistance of said first transistor in its on-state and the resistance of said reference resistor and the ratio between the resistance of said second transistor in its on-state and the total resistance of said three resistors forming said resistor divider network are of the same value, the drain potential of said first transistor and the drain potential of said second transistor are rendered to be identical to each other, the following relationship with respect to oscillation frequency being given:

$$f = \frac{\frac{V_R}{R}}{C \cdot \alpha V_R} = \frac{1}{\alpha \cdot CR}$$

where $V_R$ represents the identical drain potential of said first and second transistors, C represents the capacitance of said reference capacitor, R represents the resistance of said reference resistor, and $\alpha$ represents the ratio between the drain potential and the potential changing range in the repeated charging and discharging of said reference capacitor.

3. A CR-type oscillator circuit according to claim 1, in which said circuit includes a Schmitt circuit having two differential amplifiers whose inverting inputs being connected with each other, and an RS-type flip-flop circuit.

4. A CR-type oscillator circuit according to claim 3, in which respective noninverting inputs of said two differential amplifiers receive different comparison potentials from junctions of said resistor divider network for determining the potential changing range of the charging and discharging of said reference capacitor.

5. A CR-type oscillation circuit according to claim 1, in which said current mirror circuit comprises two P-channel transistors having their gates connected together and two N-channel transistors having likewise their gates connected together, said plurality of resistors connected in series which constitute said resistor divider network serving also as said reference resistor.

6. A CR-type oscillator circuit according to claim 1, in which said circuit includes a buffer circuit interposed between said reference resistor and said resistor divider network, the potential drop across said reference resistor being supplied through said buffer circuit to said resistor divider network for producing the comparison potentials.

* * * * *